US012757800B2

(12) United States Patent
Chang et al.

(10) Patent No.: US 12,757,800 B2
(45) Date of Patent: Oct. 6, 2026

(54) METHOD OF MAKING A MULTI-CHIP PACKAGE DEVICE

(71) Applicant: FORCE MOS TECHNOLOGY CO., LTD., New Taipei City (TW)

(72) Inventors: Yuan-Shun Chang, Hsinchu (TW); Kao-Way Tu, Hsinchu (TW); Ping-Chia Chung, New Taipei City (TW); Yu-Chan Tsai, New Taipei City (TW)

(73) Assignee: FORCE MOS TECHNOLOGY CO., LTD., New Taipei City (TW)

(*) Notice: Subject to any disclaimer, the term of this patent is extended or adjusted under 35 U.S.C. 154(b) by 325 days.

(21) Appl. No.: 18/752,025

(22) Filed: Jun. 24, 2024

(65) Prior Publication Data

US 2025/0022721 A1 Jan. 16, 2025

(30) Foreign Application Priority Data

Jul. 13, 2023 (TW) ................................ 112126252

(51) Int. Cl.
*H10W 90/00* (2026.01)
*H10W 70/04* (2026.01)
(Continued)

(52) U.S. Cl.
CPC ......... *H10W 90/00* (2026.01); *H10W 70/041* (2026.01); *H10W 70/466* (2026.01);
(Continued)

(58) Field of Classification Search
CPC . H10W 90/00; H10W 70/041; H10W 70/466; H10W 74/01; H10W 74/111;
(Continued)

(56) References Cited

U.S. PATENT DOCUMENTS

2023/0420323 A1* 12/2023 Hoya .................. H10W 40/251
2024/0113093 A1* 4/2024 Arimura ................ H10F 55/00

FOREIGN PATENT DOCUMENTS

TW 201023309 A1 6/2010
TW 201828448 A 8/2018

OTHER PUBLICATIONS

Search Report appended to an Office Action, which was issued to Taiwanese counterpart application No. 112126252 by the TIPO on Nov. 17, 2023, with an English translation thereof.

* cited by examiner

*Primary Examiner* — Ratisha Mehta
(74) *Attorney, Agent, or Firm* — Rosenberg, Klein & Lee

(57) ABSTRACT

A method for making a multi-chip package device includes: providing a lead frame unit having a plurality of lead frames, each of the lead frames having a base seat that has an upper surface and a bottom surface, and a plurality of leads; electrically attaching a transistor chip onto the base seat, the transistor chip having a plurality of electrode pads; attaching a circuit control chip to the base seat; covering the transistor chip with a main conducting part, and electrically connecting the main conducting part with at least one of the source electrode pads; electrically connecting the circuit control chip to another source electrode pad; encapsulating the transistor chip and the circuit control chip to expose a leg part; and bending the leg part that is exposed to form a planar conducting portion having a bottom surface coplanar with the bottom surface of the base seat.

9 Claims, 5 Drawing Sheets

(51) Int. Cl.

| | |
|---|---|
| ***H10W 70/40*** | (2026.01) |
| ***H10W 74/01*** | (2026.01) |
| ***H10W 74/10*** | (2026.01) |
| *H10W 70/65* | (2026.01) |
| *H10W 72/00* | (2026.01) |

(52) U.S. Cl.
CPC .......... *H10W 74/01* (2026.01); *H10W 74/111* (2026.01); *H10W 90/811* (2026.01); *H10W 70/658* (2026.01); *H10W 72/07653* (2026.01); *H10W 72/884* (2026.01); *H10W 74/10* (2026.01); *H10W 90/734* (2026.01); *H10W 90/736* (2026.01); *H10W 90/753* (2026.01); *H10W 90/754* (2026.01); *H10W 90/756* (2026.01)

(58) Field of Classification Search
CPC ............. H10W 90/811; H10W 70/658; H10W 72/07653; H10W 72/884; H10W 74/10; H10W 90/734; H10W 90/736; H10W 90/753; H10W 90/754; H10W 90/756; H10W 70/427; H10W 70/481; H10W 72/50; H10W 70/421; H10W 74/014
See application file for complete search history.

METHOD OF MAKING A MULTI-CHIP PACKAGE DEVICE

CROSS-REFERENCE TO RELATED APPLICATION

This application claims priority to Taiwanese Invention Patent Application No. 112126252, filed on Jul. 13, 2023, and incorporated by reference herein in its entirety.

FIELD

The disclosure relates to a method, and more particularly to a method of making a multi-chip package device.

BACKGROUND

As the functionality of electronic devices improves, the amount and variety of semiconductor components that are required to achieve these demands are increased. Therefore, how to reduce the increase in size while stacking and packaging multiple chips or the semiconductor components is a major development goal in the semiconductor industry.

In a conventional multi-chip package device that includes a circuit control chip and a transistor chip, the circuit control chip and the transistor chip are electrically connected to a plurality of leads of a lead frame upon which the circuit control chip and the transistor chip are disposed via bonding wires (i.e., wire bonding technology). After encapsulation using an encapsulating material, the leads are used for external electrical connection of the conventional multi-chip package device. However, the bonding wires have a greater affect on the electrical characteristics of the conventional multi-chip package device due to the bonding wires being quite thin and have larger electrical resistance. Additionally, soldering joints between the bonding wires and the leads are liable to fall off during encapsulation or other processes in the fabrication, which may cause short circuits in the finished product. Additionally, because the leads are bent to be coplanar with each other for electrical connection to external component(s), and the point of bending on each of the leads will be either within or on the edge of the encapsulating material, the conventional multi-chip package device is easily damaged by the stress buildup from bending of the leads.

Therefore, semiconductor manufactures are continuously working towards improvements in the fabrication process that is simpler and more convenient and that may be more suitable for different semiconductor designs while maintaining the same yield rates.

SUMMARY

Therefore, an object of the disclosure is to provide a method of making a multi-package device that can alleviate at least one of the drawbacks of the prior art.

According to the disclosure, the method includes: a) providing a lead frame unit having an outer frame, and a plurality of lead frames that are surrounded by the outer frame, that are connected to each other and to the outer frame, each of the lead frames having a base seat and a plurality of leads extending from the base seat and being spaced apart from each other, the base seat having an upper surface and a bottom surface opposite to the upper surface; b) for each of the lead frames, electrically attaching a transistor chip onto the upper surface of the base seat, the transistor chip having a drain electrode that is electrically connected with the base sea, a plurality of source electrode pads and a gate electrode that are located at a position opposite to the drain electrode and away from the upper surface of the base seat; c) for each of the lead frames, attaching a circuit control chip to the upper surface of the base seat, the circuit control chip being electrically isolated from the base seat of the lead frame and being spaced apart from the transistor chip on the upper surface of the base seat of the lead frame; d) for the transistor chip on each of the lead frames, covering the transistor chip on the upper surface of the base seat with a main conducting part of a metal layer and electrically connecting the main conducting part with at least one of the source electrode pads of the transistor chip, the metal layer further including a leg part extending from the main conducting part; e) for the circuit control chip of each of the lead frames, electrically connecting the circuit control chip to the leads of the lead frame, and to another source electrode pad of the transistor chip that is not connected to the main conducting part of the metal layer, and to the gate electrode of the transistor chip; f) on each of the lead frames, encapsulating a part of the metal layer, the transistor chip and the circuit control chip on the upper surface of the base seat of the lead frame with an encapsulation material and forming an encapsulation layer that exposes the bottom surface of the base seat and a portion of the leg part of the metal layer, thereby obtaining a semi-product; and g) bending the portion of the leg part of the metal layer that is exposed from the encapsulation layer towards the lead frame to form a planar conducting portion, the planar conducting portion having a conducting bottom surface that is coplanar with the bottom surface of the base seat.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
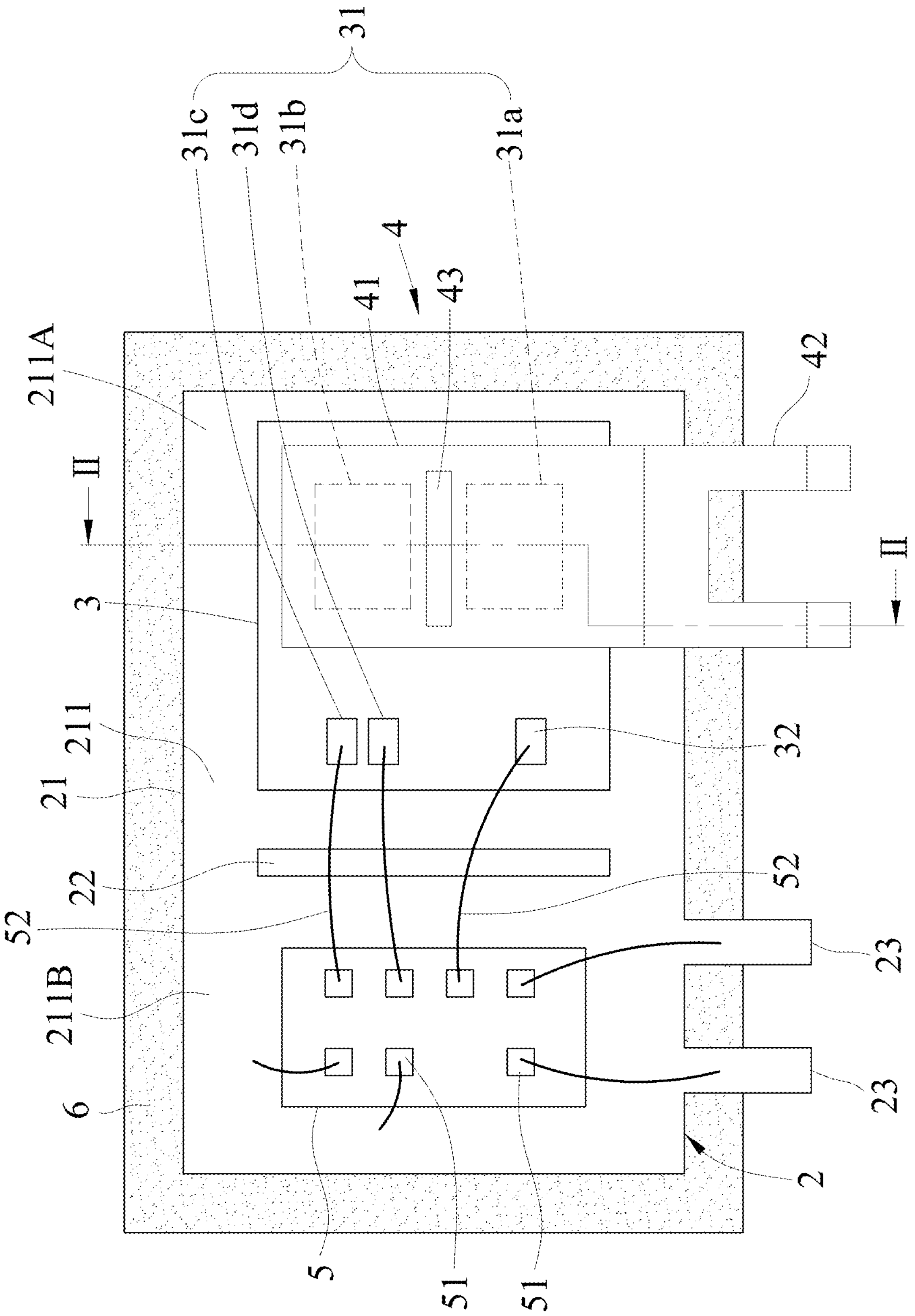
FIG. 1 is a schematic top view illustrating an embodiment of a multi-chip package device according to the present disclosure with an encapsulation layer of the multi-chip package device removed.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as “top,” “bottom,” “upper,”

"lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
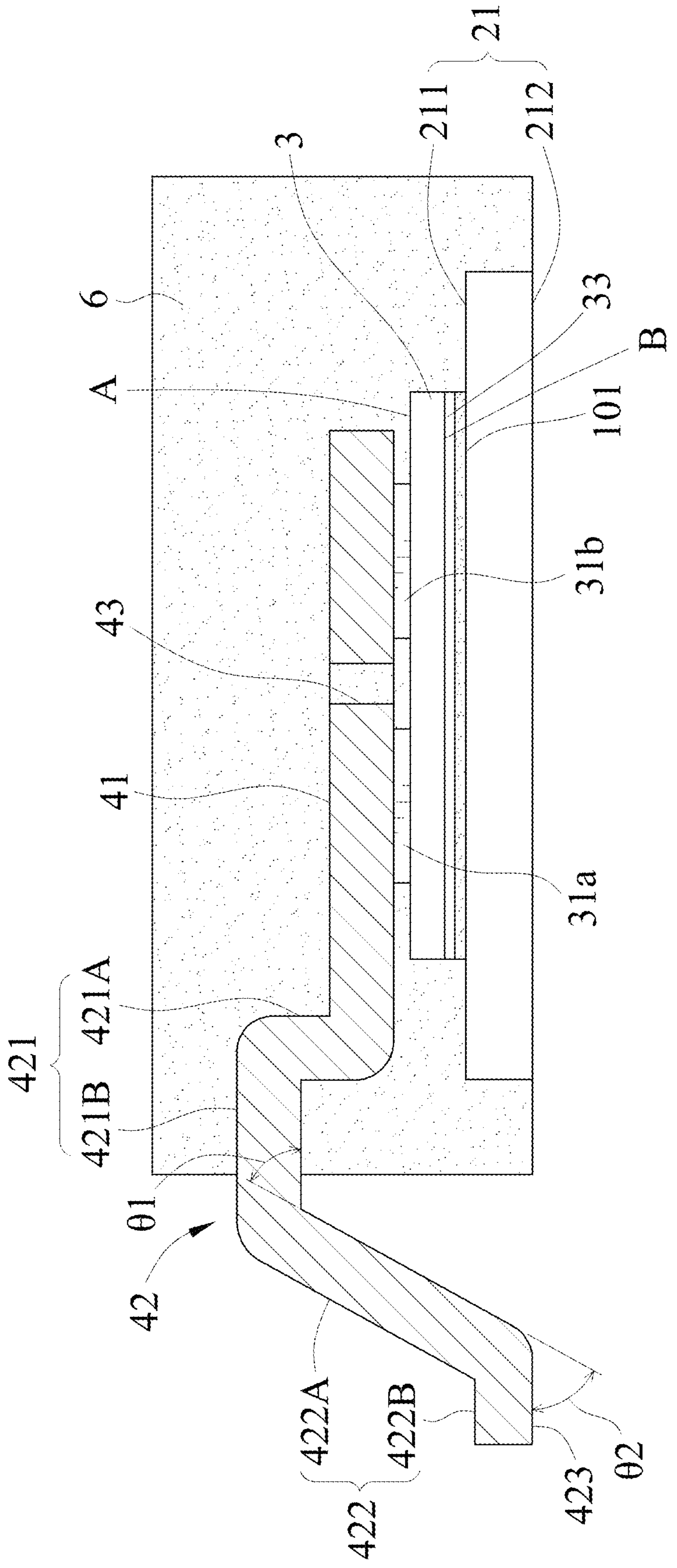
FIG. 2 is a schematic cross-sectional view of the embodiment illustrating taken along line II-II in FIG. 1 with the encapsulation layer restored.

Referring to FIGS. 1 and 2, an embodiment of a multi-chip package device according to the present disclosure includes a lead frame 2, a transistor chip 3, a metallic frame 4, a circuit control chip 5, and an encapsulation layer 6.

The lead frame 2 is made of a conducting material, and has a base seat 21, a separation wall 22, and a plurality of leads 23 that are spaced apart from each other, and that extend integrally from the base seat 21. The base seat 21 has an upper surface 211 and a bottom surface 212 opposite to the upper surface 211. The separation wall 22 is formed on the upper surface 211 of the base seat 21. In this embodiments, the separation wall 22 and the base seat 21 are made of the same material and are integrally formed in one piece. The separation wall 22 divides the upper surface 211 into a first area 211A, and a second area 211B which is opposite to the first area 221A. The circuit control chip 5 is disposed on one of the first and second areas 211A, 211B of the upper surface 211 of the base seat 21, and the leads 21 extends from at least one side of the base seat 21 from the one of the first and second areas 211A, 211B of the upper surface 211. In this embodiment, the circuit control chip 5 is disposed in the second area 211B. Therefore, the leads 23 extend from at least one side of the base seat 21 from the second area 211B of the upper surface 211 of the base seat 21.

The transistor chip 3 is disposed on the upper surface 211 of the base seat 21 via front side packaging. The transistor chip 3 includes an active surface (A), and a rear surface (B) that is opposite to the active surface (A), a plurality of source electrode pads 31 that are located on the active surface (A), a gate electrode 32 that is located on the active surface (A), and a drain electrode 33 that is located on the rear surface (B) and that is electrically connected to the base seat 21. In this embodiment, the transistor chip 3 is connected to the first area 211A of the upper surface 211 of the base seat 21 via a conductive soldering material 101. Additionally, the transistor chip 3 includes four of the source electrode pads (31*a*, 31*b*, 31*c*, and 31*d*). However, the number of source electrode pads 31 is not a limitation of the disclosure.

The metallic frame 4 has a main conducting part 41, at least one conducting leg 42, and a through hole 43. In this embodiment, there are two conducting legs 42 that are integrally formed with the main conducting part 41, and that extend from a same side of the main conducting part 41 for external electrical connection. The through hole 43 passes through the main conducting part 41. It should be noted that, in other embodiments of the disclosure, there may be one or many conducting legs 42, and the number of conducting legs 42 may be designed according to actual requirements, and may extend in different directions.

More specifically, when viewing the multi-chip packaging device from above the lead frame, the conducting legs 42 of the metallic frame 4 each has a thickness that is greater than a thickness of a standard wire. Each of the conducting legs 42 has a first conducting section 421, and a second conducting section 422. The first conducting section 421 extends and bends from the main conducting part 41 and is located at a height that is not lower than the main conducting part 41 (i.e., the first conducting section 421 is farther from the transistor chip 3 than the main conducting part 41 is). The second conducting section 422 extends and bends from the first conducting section 421 towards the lead frame 2, and has a conducting bottom surface 423 that is coplanar with the bottom surface 212 of the base seat 21 of the lead frame 2. In this embodiment, the first conducting section 421 has an extending portion 421A that extends from the main conducting part 41 and is located at a height not lower than the main conducting part 41, and a parallel portion 421B that is connected to the extending portion 421A and that is parallel to the main conducting part 41. Moreover, the second conducting section 422 has an inclined conducting portion 422A that is connected to the parallel portion 421B of the first conducting section 421 and that extends and is bent from the parallel portion 421B toward the lead frame 2, and a planar conducting portion 422B that is connected to the inclined conducting portion 422A, that is bent from and extends away from the parallel portion 421B, and that has the conducting bottom surface 423.

In order to reduce the processing requirements in later stages of fabrication and to decrease stress, the inclined conducting portion 422A is bent at a first angle ($\theta 1$) ranging from 60° to 80° relative to the parallel portion 421B, and the planar conducting portion 422B is bent at a second angle ($\theta 2$) ranging from 60° to 80° relative to the inclined conducting portion 422A. In this embodiment, the first angle ($\theta 1$) and the second angle ($\theta 2$) are both 65°. However, this is not a limitation of the disclosure.

The main conducting part 41 of the metallic frame 4 covers the transistor chip 3 and is electrically connected to at least one of the source electrode pads 31. As previously mentioned, in this embodiment, the transistor chip 3 includes four of the source electrode pads 31*a*, 31*b*, 31*c*, 31*d*, and the main conducting part 41 is electrically connected to two of the source electrode pads 31*a*, 31*b*, 31*c*, 31*d*. More specifically, in this embodiment, the main conducting part 41 is electrically connected to the source electrode pad 31*a* and the source electrode pad 31*b*, and a gap is formed between the two of the source electrode pads 31*a*, 31*b*. The through hole 43 of the main conducting part 41 corresponds in position to the gap. By having the through hole 43 that passes through the main conducting part 41 and by having the through hole 43 correspond in position to the gap, during a method for forming the multi-chip package device, when an encapsulation material is used for encapsulation, the encapsulation material may easily flow into space between the main conducting part 41 and the transistor chip 3 and achieve more complete encapsulation. In other embodiments, the transistor chip 3 includes three of the source electrode pads 31. One of the source electrode pads 31 is electrically connected to the main conducting part 41, and two of the source electrode pads 31 and the gate electrode 32 are electrically connected to the circuit control chip 5.

In some embodiments, the main conducting part 41 covers at least 50% of a surface area of the active surface (A) of the transistor chip 3. In doing so, the main conducting part 41 may provide better heat dissipation and better electromagnetic interference (EMI) shielding for the transistor chip 3.

The circuit control chip 5 is front-side packaged onto the lead frame 2. More specifically, the circuit control chip 5 is adhered to the second area 211B of the upper surface 211 of the base seat 21 via an electrical insulation adhesive 102 (see FIG. 5) and is electrically isolated from the base seat 21. The circuit control chip 5 is electrically connected to the transistor chip 3 and the leads 23. More specifically, the circuit control chip 5 has a plurality of connection pads 51 that are adapted to electrically connect with an external source, and the gate electrode 32 and at least one of the source electrode pads 31 are electrically connected to the connection pads 51 of the circuit control chip 5 via bonding wires 52. Additionally, in this embodiment, the circuit control chip 5 is electrically connected to the leads 23 via wires. In this embodiment, the circuit control chip 5 is electrically connected to two source electrode pads 31*c*, 31*d*, the leads 23 and the second area 211B of the upper surface 211 of the base seat 21 via bonding wires 52, the transistor chip 3 controls and provides feedback to signals from the circuit control chip 5 via the leads 23 and the base seat 21.

It should be noted that, the separation wall 22 is used to enforce more separation between the conductive soldering material 101 and the electrical insulation adhesive 102 in order to prevent overflow of either material when attaching the transistor chip 3 or the circuit control chip 5 to the base seat 21. However, the separation wall 22 may be omitted in some embodiments.

The encapsulation layer 6 is made of an encapsulation material, envelops the lead frame 2, the transistor chip 3, the main conducting part 41 of the metallic frame 4, the first conducting section 421 of the conducting leg 42 of the metallic frame 4, and the circuit control chip 5 and exposes the bottom surface 212 of the base seat 21, and the second conducting section 422 of the conducting leg 42. During encapsulation, the encapsulation material will flow through the through hole 43 of the main conducting part 41 to reach the space between the main conducting part 41 and the transistor chip 3.

Figure 3:
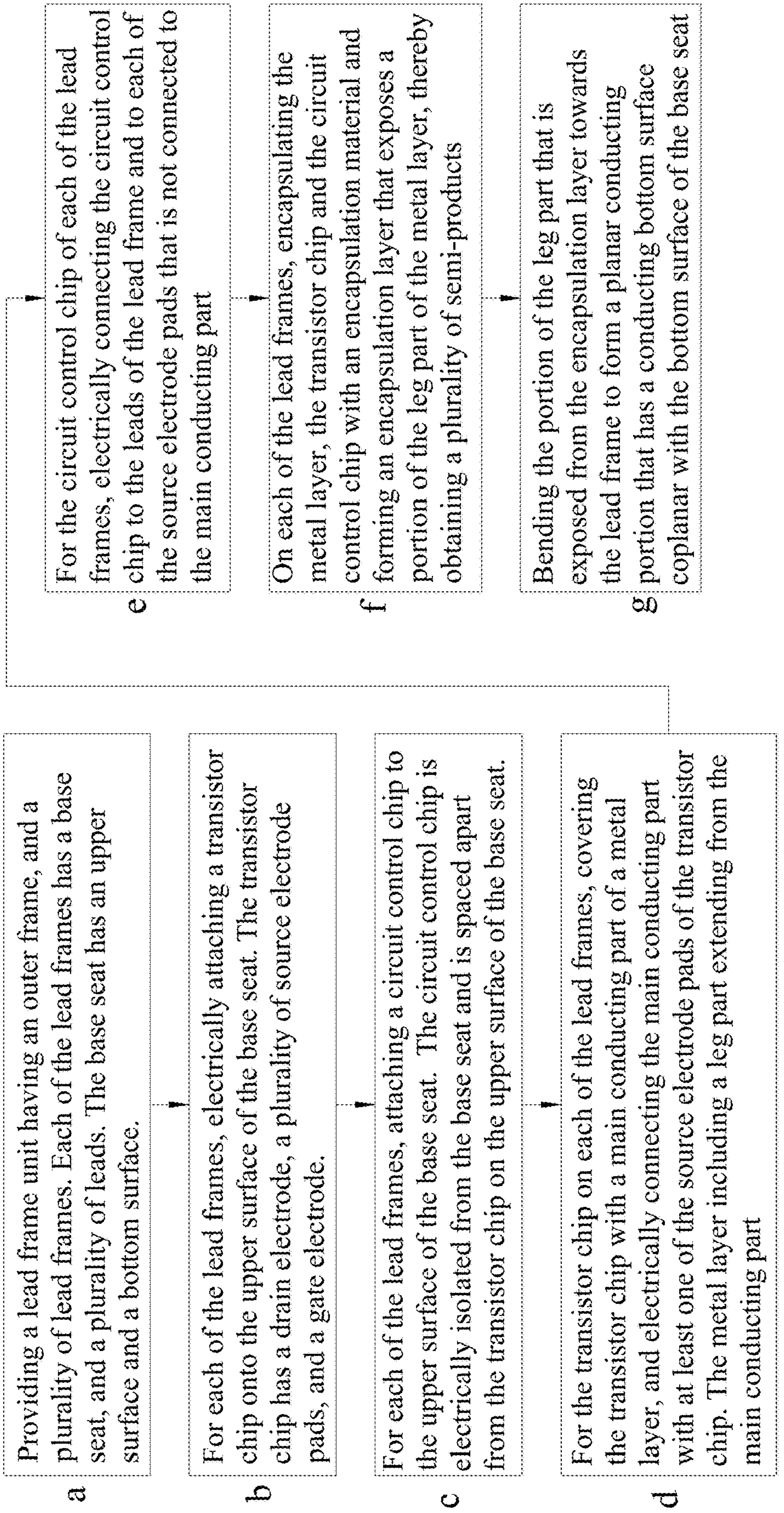
FIG. 3 is a flow chart showing an embodiment of a method for making a multi-chip package device according to the present disclosure.

Referring to FIG. 3, an embodiment of a method of making a multi-package device according to the present disclosure includes steps a) to g).

Figure 4:
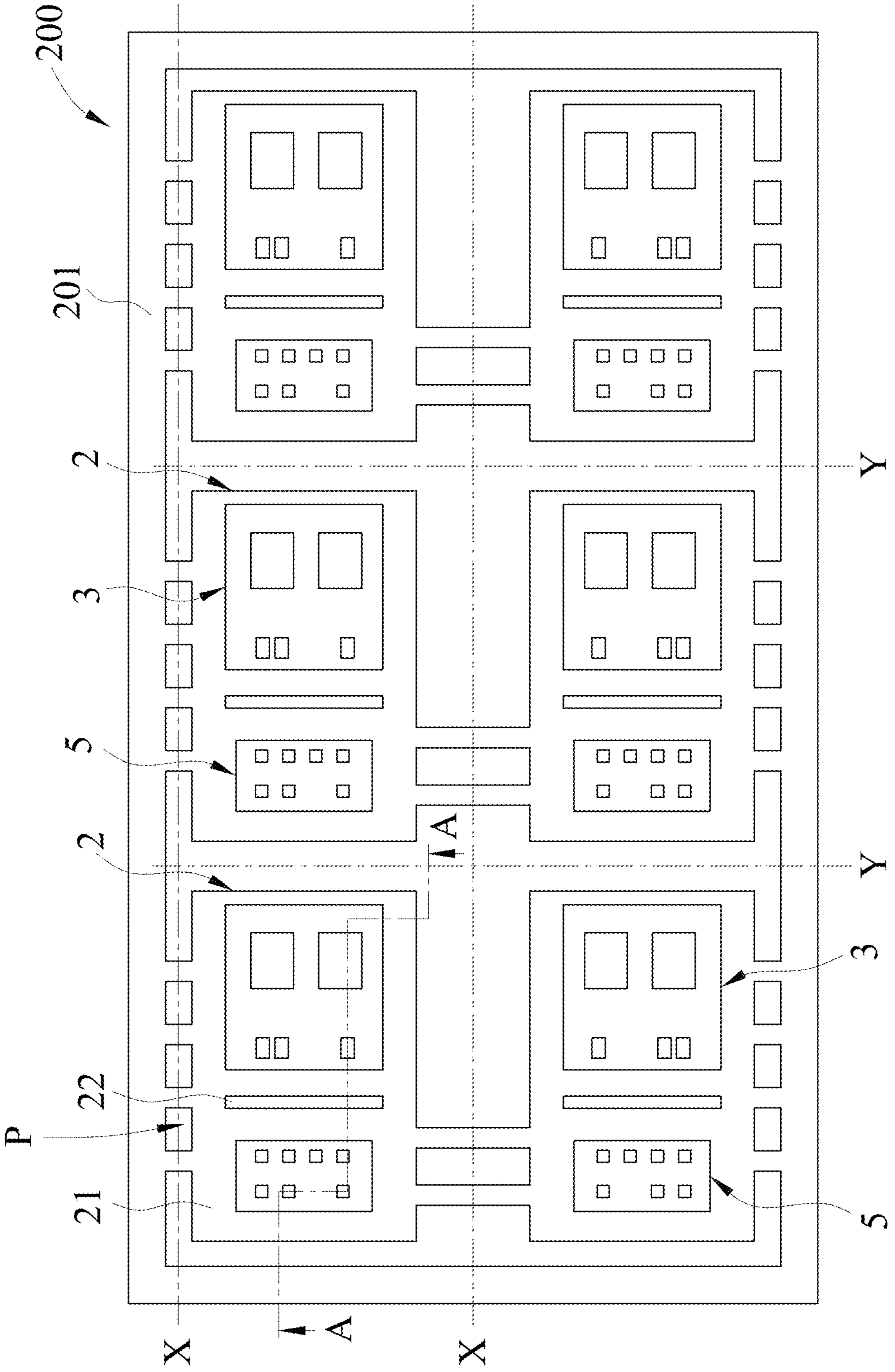
FIG. 4 is a top view illustrating a plurality of semi-products.

Referring to FIG. 4, in the step a) of the method, a lead frame unit 200 is provided. The lead frame unit 200 has an outer frame 201, and a plurality of lead frames 2 surrounded by the outer frame 200, and connected to each other and to the outer frame 201. Each of the lead frames 2 has a structure the same as that of the lead frame 2 shown in FIG. 1, and the detailed description thereof is omitted herein for the sake of brevity. It is noted that in this embodiment, the lead frame unit 200 may be manufactured via a stamping process, and the lead frames 2 may be arranged in an array.

Figure 5:
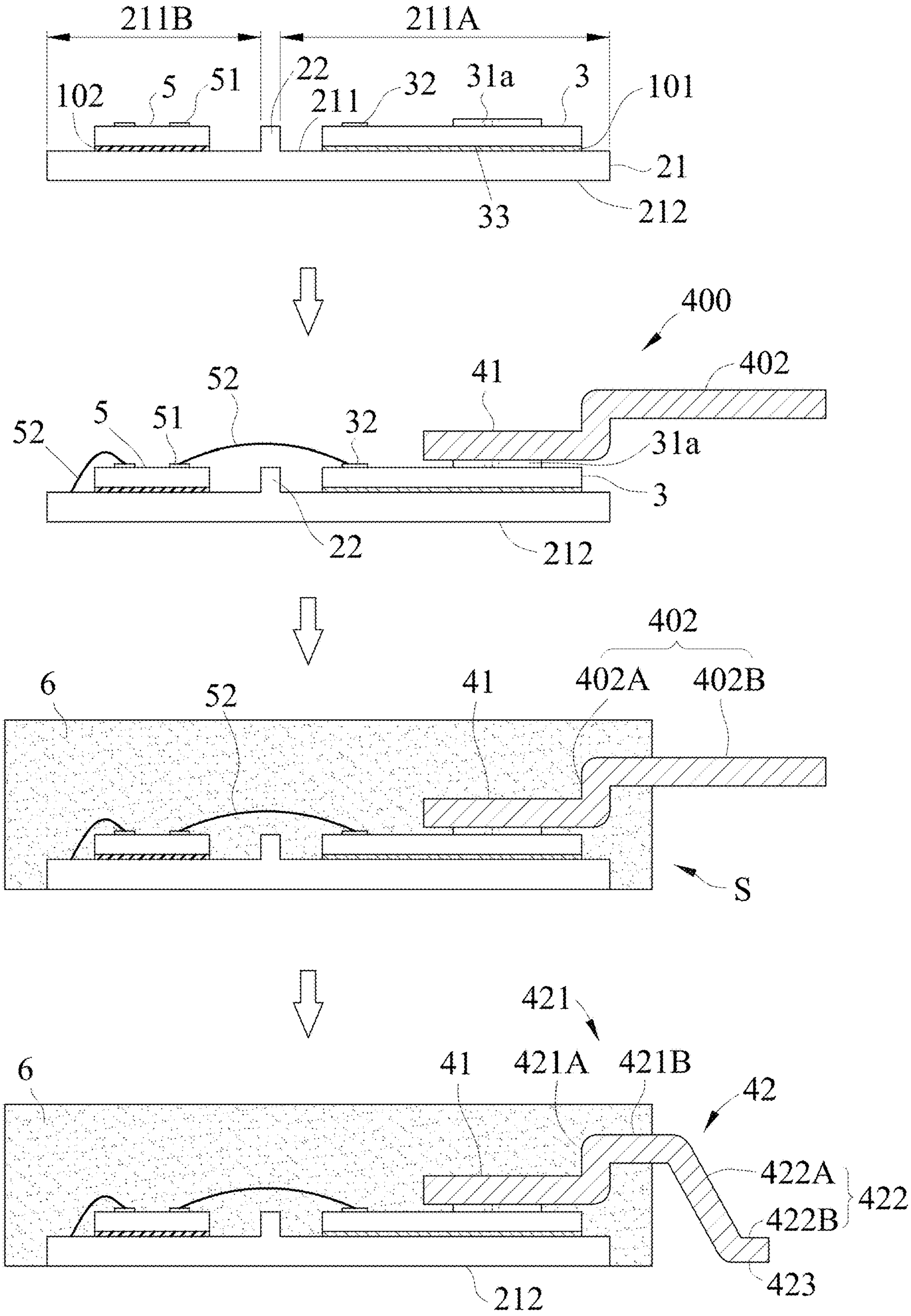
FIG. 5 is a series of cross-sectional views illustrating various stages of the method shown in FIG. 3, in which the topmost one of the cross-sectional views is taken along line A-A of FIG. 4.

Referring to FIGS. 4 and 5, in the step b), for each of the lead frames 2, a transistor chip 3 is electrically attached onto the upper surface 211 of the base seat 21. The transistor chip 3 has a structure and arrangement that are the same as those of the transistor chip 3 shown in FIG. 1. The drain electrode 33 of the transistor chip 3 is electrically connected to the first area 211A of the upper surface 211 of the base seat 21 through a conductive soldering material.

Next, in the step c), for each of the lead frames 2, a circuit control chip 5 is attached to the second area 211B of the upper surface 211 of the base seat 21 using an electrical insulation adhesive 102 so as to obtain a semi-product (P) that includes the lead frame 2, the transistor chip 3 and the circuit control chip 5. The circuit control chip 5 has a structure and arrangement the same as those of the circuit control chip 5 shown in FIG. 1. The circuit control chip 5 is electrically isolated from the base seat 21. In this embodiment, each of the lead frames 2 has the separation wall 22 that is formed on the upper surface 211 of the base seat 21 and that divides the upper surface 211 into the first area 211A and the second area 211B, so that the conductive soldering material 101 may be segregated from the electrical insulation adhesive 102, thereby ensuring the transistor chip 3 and the circuit control chip 5 will each have their own proper electrical characteristics.

Next, in the step d), for each of the semi-products (P), a metal layer 400 is provided to adhere to the active surface (A) of the transistor chips 3 on the lead frame 2. The metal layer 400 has a main conducting part 41, a leg part 402 and a through hole extending through the main conducting part 41. The main conducting part 41 and the through hole have structures and arrangements the same as those of the main conducting part 41 and the through hole 43 shown in FIGS. 1 and 2, respectively. The transistor chip 3 on the upper surface 211 of the base seat 21 is covered with the main conducting part 41 of the metal layer 400. The main conducting part 41 is electrically connected with at least one of the source electrode pads 31 of the transistor chip 3. The leg part 402 extends from the main conducting part 41, and has a first section 402A and a second section 402B. The first section 402A extends and is bent from the main conducting part 41, and extends at a height that is not lower than the main conducting part 41. The second section 402B extends from the first section 402A away from and parallel to the main conducting part 41. More specifically, in this embodiment, the transistor chip 3 includes four of the source electrode pads 31*a*, 31*b*, 31*c*, 31*d*, a gap is formed between two of the source electrode pads 31*a*, 31*b*, and the main conducting part 41 of the metal layer 400 is electrically connected to the two source electrode pads 31*a*, 31*b*, via soldering, and has the through hole that corresponds in position to the gap.

Afterwards, in the step e), for each of the semi-products (P), the circuit control chip 5 is electrically connected to the leads 23 of the lead frame 2, and to the source electrode pads 31*c*, 31*d* that are not connected to the main conducting part 41 of the metal layer 400, and the gate electrode 32 of the transistor chip 3. More specifically, the circuit control chip 5 is electrically connected to the various components mention above via bonding wires 52.

Next, in the step f), on each of the lead frames 2, a part of the metal layer 400, the transistor chip 3, and the circuit control chip 5 is encapsulated with an encapsulation material and forms an encapsulation layer 6 that exposes the bottom surface 212 of the base seat 21 and a portion of the leg part 402 of the metal layer 400, thereby obtaining a plurality of semi-products(S) that are located within the outer frame 201. More specifically, for each of the semi-products(S), the metal layer 400, the transistor chip 3, and the circuit control chip 5 are encapsulated via molding of the encapsulation material. In some embodiments, the metal layer 400 is encapsulated to expose at least a portion of the second section 402B from the encapsulation layer 6.

Next, in the step g), the semi-products(S) that are connected to the outer frame 201 and with one another are cut along lines X and Y so that the semi-products(S) are separated from each other. For each of the semi-products(S), the portion of the second section 402B of the leg part 402 that is exposed from the encapsulation layer 6 is bent so that the leg part 402 is formed into a conducting leg 42 which may have a structure and arrangement the same as those of the conducting leg 42 shown in FIG. 2. That is, in this embodiment, the metal layer 400 is formed into the metallic frame 4 as shown in FIGS. 1 and 2.

In summary of the above, in the multi-chip package device according to the disclosure, the conducting leg 42 of the metallic frame 4 is used as a connector for the transistor chip 3 for external electrical connection, this allows the multi-chip package device of the disclosure to omit having that soldering joints, which eliminates the falling-off problem of the soldering joints encountered by conventional multi-chip packaging devices. Furthermore, in this disclosure, since bending of the second section 402B of the leg part 402 is conducted after encapsulation, and since the second conducting section 422 formed by bending the second section 402B is formed outside of the encapsulation layer 6, the stress generated by bending the second section 402B would have less influence on the encapsulation layer 6, thereby eliminating the likelihood of damage that may occur at an interface between the encapsulation layer 6 and the conducting leg 42.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method of making a multi-chip package device comprising:

a) providing a lead frame unit having an outer frame, and a plurality of lead frames that are surrounded by the outer frame, that are connected to each other and to the outer frame, each of the lead frames having a base seat and a plurality of leads extending from the base seat and being spaced apart from each other, the base seat having an upper surface and a bottom surface opposite to the upper surface;

b) for each of the lead frames, electrically attaching a transistor chip onto the upper surface of the base seat, the transistor chip having a drain electrode that is electrically connected with the base seat, a plurality of source electrode pads and a gate electrode that are located at a position opposite to the drain electrode and away from the upper surface of the base seat;

c) for each of the lead frames, attaching a circuit control chip to the upper surface of the base seat, the circuit control chip being electrically isolated from the base seat of the lead frame and being spaced apart from the transistor chip on the upper surface of the base seat of the lead frame;

d) for the transistor chip on each of the lead frames, covering the transistor chip on the upper surface of the base seat with a main conducting part of a metal layer and electrically connecting the main conducting part with at least one of the source electrode pads of the transistor chip, the metal layer further including a leg part extending from the main conducting part;

e) for the circuit control chip of each of the lead frames, electrically connecting the circuit control chip to the leads of the lead frame, and to another source electrode pad of the transistor chip that is not connected to the main conducting part of the metal layer, and to the gate electrode of the transistor chip;

f) on each of the lead frames, encapsulating a part of the metal layer, the transistor chip and the circuit control chip on the upper surface of the base seat of the lead frame with an encapsulation material and forming an encapsulation layer that exposes the bottom surface of the base seat and a portion of the leg part of the metal layer, thereby obtaining a semi-product; and g) bending the portion of the leg part of the metal layer that is exposed from the encapsulation layer towards the lead frame to form a planar conducting portion, the planar conducting portion having a conducting bottom surface that is coplanar with the bottom surface of the base seat.

2. The method of making a multi-chip package device as claimed in claim 1, wherein:

each of said lead frames has a separation wall formed on the upper surface of the base seat that divides the upper surface into a first area upon which the transistor chip is disposed, and a second area upon which the circuit control chip is disposed, and which is opposite to said first area; and the leads extends from at least one side of the second area of the upper surface of the base seat.

3. The method of making the multi-chip package device as claimed in claim 2, wherein the separation wall and the base seat are made of a same material and are integrally formed in one piece.

4. The method of making the multi-chip package device as claimed in claim 1, wherein:

the leg part of the metal layer has a first section that connects to and extends away from the main conducting part and that is extending at a height not lower than the main conducting part, and a second section that extends from the first section away from and parallel to the main conducting part;

in the step f), the metal layer is encapsulated to expose at least a portion of the second section from the encapsulation layer;

in the step g), the portion of the second section that is exposed from the encapsulation layer is bent towards the lead frame to form a parallel portion that is parallel to the main conducting part, an inclined conducting portion that is connected to the parallel portion, and that is bent at an angle ranging from 60° to 80° relative to the parallel portion, and the planar conducting portion that is connected to the inclined conducting portion, and that is bent at an angle ranging from 60° to 80° relative to the inclined conducting portion.

5. The method of making the multi-chip package device as claimed in claim 1, wherein in the step e), the circuit control chip is electrically connected to the leads of the lead frame, and to the another source electrode pads, and to the gate electrode of the transistor chip via wire bonding.

6. The method of making the multi-chip package device as claimed in claim 1, wherein in the step b), the transistor chip is electrically attached onto the upper surface of the base seat using a conductive soldering material.

7. The method of making the multi-chip package device as claimed in claim 1, wherein in the step c), the circuit control chip is attached to the upper surface of the base seat using an electrical insulation adhesive.

8. The method of making the multi-chip package device as claimed in claim 1, wherein in the step d):

the transistor chip includes four of the source electrode pads; and the main conducting part of the metal layer is electrically connected to the two of the source electrode pads via soldering.

9. The method of making the multi-chip package device as claimed in claim 8, wherein:

a gap is formed between two of the source electrode pads; and the transistor chip has a through hole that extends through the main conducting part and that corresponds in position to the gap.

* * * * *